United States Patent [19]
Hornig et al.

[11] Patent Number: 5,633,531
[45] Date of Patent: May 27, 1997

[54] COMPRESSION GLASS LEAD-IN ARRANGEMENT

[75] Inventors: Wolfgang Hornig, Eckenhaid, Germany; Walter Findl, Vinenna, Austria

[73] Assignees: Diehl GmbH & Co., Germany; Electrovac, Fabrikation elektrotechnischer Spezialartikel Gesellschaft M.B.H., Austria

[21] Appl. No.: 477,578

[22] Filed: Jun. 7, 1995

Related U.S. Application Data

[63] Continuation of Ser. No. 79,983, Jun. 18, 1993, abandoned.

[30] Foreign Application Priority Data

Jun. 18, 1992 [DE] Germany ............ 42 19 953.0

[51] Int. Cl.⁶ ............ H01L 23/04; H01L 23/02
[52] U.S. Cl. ............ 257/699; 257/678; 257/698
[58] Field of Search .......... 257/666, 668, 257/678, 682, 687, 689, 698, 699, 708, 709, 710

[56] References Cited

U.S. PATENT DOCUMENTS

| | | |
|---|---|---|
| 4,128,697 | 12/1978 | Simpson . |
| 4,142,918 | 3/1979 | Plewes . |
| 4,309,507 | 1/1982 | Davis et al. ............ 257/709 |
| 4,349,635 | 9/1982 | Davis et al. . |
| 4,678,358 | 7/1987 | Layher . |
| 4,805,009 | 2/1989 | Pryor et al. . |

FOREIGN PATENT DOCUMENTS

| | | |
|---|---|---|
| 0114338 | 8/1984 | European Pat. Off. . |
| 0114917 | 8/1984 | European Pat. Off. . |
| 0163510 | 12/1984 | European Pat. Off. . |
| 0178481 | 4/1986 | European Pat. Off. . |
| 2120324 | 8/1972 | France . |
| 1300439 | 12/1972 | United Kingdom . |
| 88/05254 | 7/1988 | WIPO . |
| 90/02712 | 3/1990 | WIPO . |

OTHER PUBLICATIONS

R. Lomerson, "Batch–Made Package Hold Dense IC's, Save Space, Survive Tough Environments", *Electronics*, Bd. 56, Nr. 8, pp. 155–159 (1983).

*Primary Examiner*—Carl W. Whitehead
*Attorney, Agent, or Firm*—Scully, Scott, Murphy & Presser

[57] ABSTRACT

A compression glass lead-in arrangement in a metal body, especially in metal housings for semiconductors, in particular integrated circuits. The lead-through arrangements hermetically seal the interior of the housing relative to the environment. A glass bead is fused into a bore in the housing and the connecting conductor of the integrated circuit is passed outwardly through the glass. Alloys of the systems Cu, Al and Mg, during a cooling phase after the fusing-in exhibit a hardening effect which provides that in conjunction with the alloys, it is possible to produce compression glass lead-in arrangements which possess a hermetic sealing integrity even after a high degree of thermal and/or mechanical loading, have a high resistance to fluctuations in temperature and good resistance to corrosion.

11 Claims, 4 Drawing Sheets

COMPRESSION GLASS LEAD-IN ARRANGEMENT

This is a continuation of application Ser. No. 08/079,983, filed on Jun. 18, 1993, now abandoned.

BACKGROUND OF THE INVENTION

1. Field of the Invention

The present invention relates to a compression glass lead-in or lead-through arrangement in a metal body, in which molten glass is introduced, such as by being fused, into an opening in the metal body, the latter of which is heated to high temperature, wherein the coefficient of expansion of the glass is lower than that of the metal, and the treating temperatures thereof lie within or lower than the range of the solidus temperature of the metal; and wherein the elastic limit of the metal may not be exceeded at any time during a subsequent cooling process.

2. Discussion of the Prior Art

Compression-type glass lead-through or lead-in arrangements of the kind considered herein are generally known in the art and are commercially available on the market in large-scale quantities; in particular for utilization for the housings of semiconductors; and even more especially, with regard to housings for integrated circuits which are adapted to be mounted or located on a substrate. The electrical terminals of the integrated circuits are to be conducted outwardly through openings formed in the housing and, in such instances, there must be present an insulation with regard to the ordinarily metallic housings. The insulative effect is provided by a glass bead which is fused into the lead-in arrangement for the housing, and which at the center thereof retains the electrical terminal conductor of the circuit at a location where it passes through the housing. Concurrently, the glass bead serves the function of hermetically sealing the interior of the housing with respect to the surroundings or outside air. Ensuring this hermetic sealing action which must be sustained during operations over a broad temperature range, is required in the production of such compression glass lead-through or lead-in arrangements.

In compression glass lead-in or lead-through arrangements of this kind, the coefficient of thermal expansion of the metal body must be substantially higher than that of the fused-in glass and that of the internal metallic conductor. After the glass has been fused into the metal body which has been heated to high temperature, the external metal portion shrinks onto the glass body during the subsequent cooling phase in consequence of its substantially higher degree or rate of contraction. As the compressive strength of various types of glass exceeds their tensile strengths at about from 10 to 20 times, that physical aspect can be utilized with regard to the process of fusing-in the compression glass, to the effect that the encountenance of tensile stresses in the glass is securely eliminated through the initial presence of a high compressive stress acting on all sides of the glass body, even in the event of the glass lead-through arrangement being subjected to severe mechanical and/or thermal loads.

The compressive stresses which are applied to the glass body due to the shrinkage of the metal portion during the cooling phase give rise in the metal part to tangentially directed tensile stresses of considerable magnitude. Any plasticity; in essence, any permanent deformation caused by the elastic limit; i.e. yield point, being exceeded must be prevented from occurrence in the metal body by means of appropriate dimensioning of tolerances in the metal body and bores, and by suitable material selection of the metal and glass. More specifically, such a phenomenon would result in that the required reserve of compressive stress would no longer be present in the event of thermal loading and which, in turn, would then result in a reduced level of thermal and mechanical resistance to shock by the compression glass lead-through arrangement, while also resulting in the latter no longer possessing the necessary vacuum-tight sealing integrity at room temperature, and without any loading thereof being involved. Accordingly, it is necessary for the level of any tensile strength and the elastic limit of the metal employed to be sufficiently high.

Heretofore, iron-nickel alloys and steels have essentially been employed for such compression glass lead-in or lead-through arrangements. Titanium alloys have also been used at this time for special applications; namely for the housings of cardiac pacemakers; nevertheless, such titanium alloys, by virtue of the particular physiological requirements involved, must possess properties which are evidently different from those which are required with regard to ordinary metal bodies of this type.

The mentioned alloys of iron-nickel and steel have an elastic limit of >200 N/mm$^2$ and a coefficient of thermal expansion $\alpha$ of about 80–180×10$^{-7}$/°C. The latter is markedly different from the coefficient of thermal expansion of the appropriately used kinds of glass, which is about 45–100×10$^{-7}$/°C. The foregoing materials possess the advantage in that they regain their high elastic limit during the cooling phase after the fusing-in procedure, and by virtue of the different coefficients of thermal expansion relative to glass, can still exert a highly excessive compressive stress on the glass body, even during the cooling phase and also at room temperature.

However, materials of the above-indicated kind no longer fulfill the ever increasing requirements of industry which are placed thereon with respect to contemplated future housings for semiconductors and which, in particular, are characterized by a higher level of thermal conductivity, ease of machinability, and a high degree of resistance to encountered fluctuations in temperature, and can be produced at low cost.

Copper and aluminum alloys which are ordinarily commercially available and which to some extent possess such desirable properties; are nevertheless subject to such a low elastic limit that they already encounter plastic deformations during the cooling phase, and as a consequence, the compression glass lead-through arrangement can no longer be produced to be able to facilitate a hermetically-sealed condition.

In addition to the above-described kind of assembly involving metal-glass fusion, in effect, producing the compression glass lead-in or lead-through arrangement, there is also presently known the so-called "matched" lead-through arrangement, which is not the subject matter of the present invention but which is referred to herein for purposes of presenting a comparison with regard to the advantages of the invention. That other arrangement is characterized in that all of the cooperating components which are to be fused; in effect, the outer metal portion, glass body, internal metallic conductor, are 'matched'; in essence, their coefficients of thermal expansion remain approximately the same over a wide temperature range. The result of this is that, with such kind of utilization, the occurrence of stresses need not be considered as a result of different degrees of contraction during the cooling phase, and accordingly the elastic limit of the outer metal portion does not represent any crucial criterion with regard to the design of such a housing.

Currently, iron-nickel-cobalt alloys which are commercially available under the tradename "Kovar" are used for such 'matched' lead-through arrangements; in the so-called 'low-level matched' design configuration. The alloys have a coefficient of thermal expansion of approximately 45–55× $10^{-7}$/°C. The coefficient of expansion of the various types of glass used for that purpose, and that of the metallic inner conductor, is of the same order of magnitude.

The use of Kovar provides the advantage that the thermal load-carrying capacity, such as the temperature and shock resistance, of a housing produced from that material is considerably higher than that found for the normal compression-type glass lead-through arrangements. Therefore, recourse is preferably had to this design which, in the interim, has proven itself over a lengthy period of time, in particular where there is a need for the presence of a high degree of reliability for the component in connection with critical temperature influences.

An alternative form of the 'high-level matched' lead-through arrangement is also conceivable and has been produced to some minor extent in commerce. In that arrangement, the cooperating fusion components once again possess approximately equal coefficients of thermal expansion, however, the absolute value u is not within the range of $80–100\times10^{-7}$/°C. Lead-through arrangements with still higher coefficients of thermal expansion can also be conceived, but are not employed in actual practice because, on the one hand, the kinds of glass required for that purpose afford only a low level of chemical resistance and inadequate insulating properties and, as a result, are not suitable for their reliable employment, while on the other hand, because of the fact that the resistance to fluctuations in temperature drops off severely at rising coefficients of expansion of the matched material pairings.

Consequently, the advantage of obtaining a good resistance to fluctuations in temperature is only encountered in the case of 'low-level matched' lead-in or lead-through arrangements. Housings of "Kovar" are currently in use, although they are substantially more expensive than compression glass lead-in arrangements, and even though they are subject to the not inconsiderable disadvantage of possessing a poor thermal conductivity, and with the material thereof being more difficult to machine.

It is therefore desirable to be able to produce a compression glass lead-in arrangement from a material which is easier to handle and process than Kovar and which, on the one hand, distinguishes itself through improved physical properties while, nonetheless, fulfilling all critical requirements placed thereon and, on the other hand, being an equal match to Kovar with regard to resistance to fluctuations in temperature.

SUMMARY OF THE INVENTION

Accordingly, the present invention proposes the use of alloys which afford a good thermal conductivity, a good workability and satisfactory capability for their manufacture and also, in particular, a high degree of resistance to fluctuations in temperature and resistance to corrosion.

The problem which is solved by the present invention is the employment of a metal alloy which exhibits a hardening effect during the cooling phase, and in which the permissible cooling curves for the cooling rate of the compression glass lead-in arrangement (metal-glass), extend below the highest permissible cooling rate of the glass and above the least required cooling rate for the metal.

The implementation of the present invention therefore resides in the aspect that such alloys are to be used which, in contrast with normal alloys, undergo a hardening effect; in particular as encountered in the case of spinodal alloys. The foregoing provides that such alloys, during cooling, increase their elastic limit in a manner such that the elastic limit of the metal is not exceeded upon being cooled to room temperature or even down to lower negative temperatures.

The limiting condition which applies with respect to the suitable selection of such alloys, is that the optimum cooling procedure which results in that particular increase in the elastic limit takes place in such a manner that it is also matched to the solidification behavior or characteristics of the glass during the cooling phase. Only in that manner is there obtained an assurance that the elastic limit of the metal is not exceeded during the joint cooling of the metal body and the glass, thus avoiding any damage at the interfacing region between the metal and the glass.

Hardenable non-ferrous metal alloys which solve the problem pursuant to the invention and which conform to the above-mentioned conditions can, preferably, be selected from the systems of copper or aluminum or magnesium. Lithium is also a potential possibility but has not yet been fully investigated and verified as to its desired characteristics.

Alloys of the composition copper (balance), 0.1–10% Ni, 0.1–12% Sn and 0–0.4% Mn have proven themselves to be particularly advantageous in accordance with the invention. It has been found in that respect, that alloys with a high nickel and tin content retain their hermetically-sealing effectiveness up to a high temperature range (working temperature), whereas alloys with a low nickel and tin content possess a clearly higher level of thermal conductivity but remain hermetically-sealing only up to a lower working temperature. Very good resistance to fluctuations in temperature, particularly with respect to the first-mentioned group of alloys, and a very good level of resistance to corrosion, which renders subsequent surface treatment unnecessary, are outstanding properties possessed by those alloys.

It has also been found that alloys of the composition Cu (balance), 0.1–5% Cr and 0.01–5% Zr are also well suited to be employed pursuant to the invention.

Considering the range of aluminum alloys, preferably those with the composition Al Cu Zn Mg, or Al Zn Mg, or Al Mg Si are to be selected therefrom.

Commercially available types of glass are used as the glass for the fusing; for example, such as are commercially sold by Nippon Electric Corporation or Corning Glass Corporation, under the trade names Corning 7052, Corning 9013 or Nippon ST4. Glass types of the last-mentioned kind involve a composition of 65% $SiO_2$, 5% $Al_2O_3$, 15% BaO and ZnO and 15% $Na_2O+K_2O+LiO_2$ (all in percent by weight).

A wide range of applications for compression-type glass lead-in arrangements is for the housings of semiconductors, especially those which are used for so-called hybrid circuits. The latter are integrated circuits which are disposed on a ceramic substrate or the like, while further components may be additionally disposed on the substrate. Such housings are being increasingly used in the power and micro-electronic sectors, in opto-electronics and in the sensor technology. In this connection, it is desirable that; for example, the above-mentioned copper alloys afford a good laser weldability. This is important inasmuch as a cover which is to close the housing must also provide a hermetic sealing configuration. In that connection, the housing and the contents thereof may not be permitted to be damaged by the welding operation.

A feature of the invention provides that the compression glass lead-in arrangement is cooled from a temperature of 800°–1000° C. down to about room temperature at a rate of >10°/minute. A cooling operation of that kind can be effected; for instance, by a suitable design of a furnace cooling section for the arrangement.

An increase in the elastic limit during the cooling procedure or phase is achieved in accordance with a further feature of the invention in that, during the cooling procedure, the temperature is maintained constant, preferably within the range of 250°–450° C., for a period of between several minutes to several hours, before carrying out further cooling.

In addition to the above-mentioned features, and with the result of obtaining a further increase in that elastic limit, there can further be provided in accordance with the invention that, after the cooling procedure, the compression glass lead-in arrangement is again heated to a temperature of between 250° C. and 450° C., preferably about 320° C., and aged while heated for a period of between 1 minute and 10 hours, preferably 2 to 6 hours.

A similar result can be achieved by the compression glass lead-in arrangement after the cooling phase, by being heated to a temperature of at least 250° C. and from there heated stepwise to a maximum of 450° C., and during that operation being held at each step for a period of between 1 minute and 2 hours.

BRIEF DESCRIPTION OF THE DRAWINGS

The invention is now described hereinbelow in greater detail, with reference to the accompanying drawings; in which.

DETAILED DESCRIPTION

Figures 1, 2:
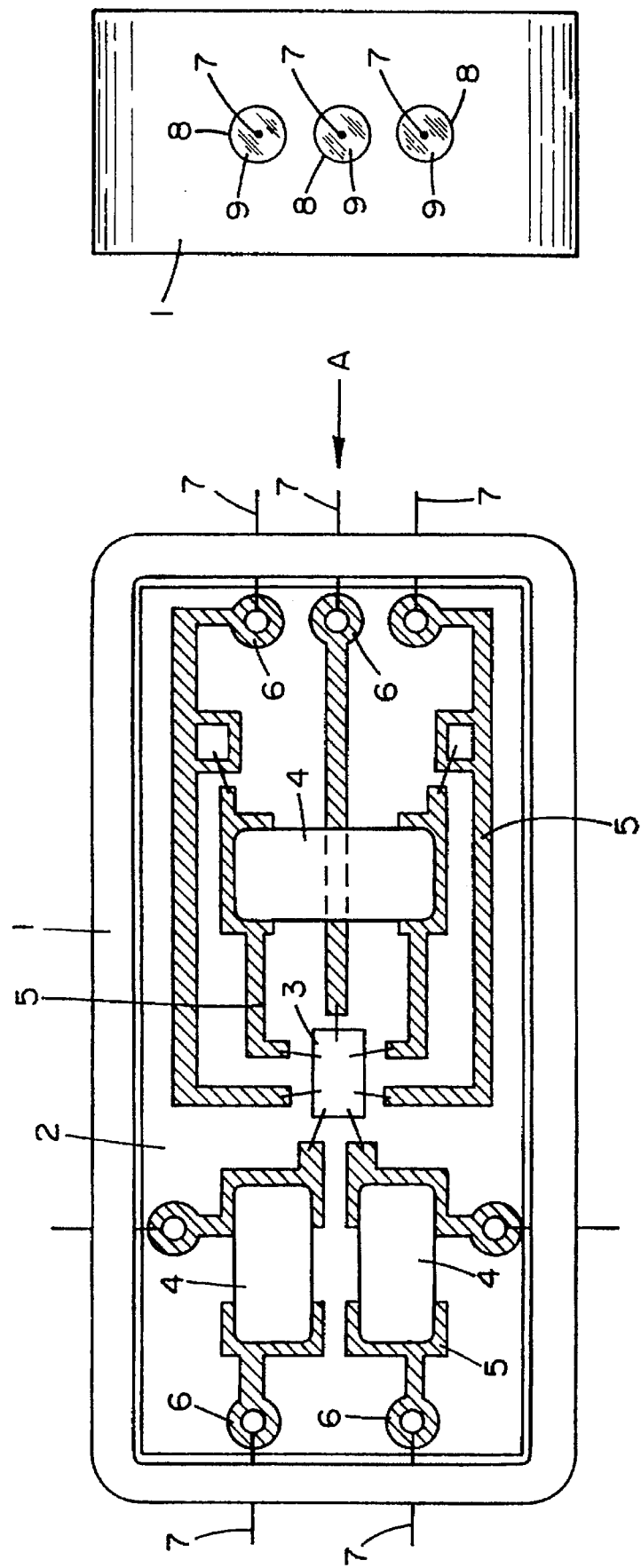
FIG. 1 illustrates a top plan view of a hybrid housing for an integrated circuit.
FIG. 2 illustrates a view of the housing in the direction indicated by the arrow A in FIG. 1.

FIG. 1 is a top plan view of a hybrid housing 1 which is made from a hardenable alloy. Disposed on the bottom of the housing interior is a ceramic substrate board or plate 2 on which there are arranged an integrated circuit 3 and electronic structural groups 4, and which are electrically connected by means of conductor tracks or paths 5. The end points 6 of each of the conductor paths are led out of the housing by means of electrical conductors 7 through glass lead-through or lead-in arrangements (not shown). A cover, preferably of the same material as the housing, is welded onto the housing after the ceramic substrate board 2 has been fitted into the housing and the forming of the hybrid circuit has been completed. The welding operation is preferably carried out by means of a laser. The particularity thereof resides in that the housing must be hermetically sealed relative to the environment or exterior air in order to protect its interior from deleterious influences, such as gases, vapors or moisture.

FIG. 2 shows the metal housing 1 in a view in the direction of the arrow A. In the metal housing there are shown three bores 8 in which the conductors 7 are disposed. The bores 8 are filled by glass beads 9 which are fused into the bores, and are hermetically sealed off with regard to both the metal housing 1 and also the conductor 7.

Sealing off of the conductors 7 by means of the glass beads 9 does not represent a major technical problem and is not the subject matter of this invention. The important consideration in this context is primarily that the coefficients of expansion of the conductor 7 and of the glass bead 9 are approximately equal to each other. The object of the invention which is to be attained lies in sealing off the interface between the metal housing 1 and the glass bead 9.

Figure 3:
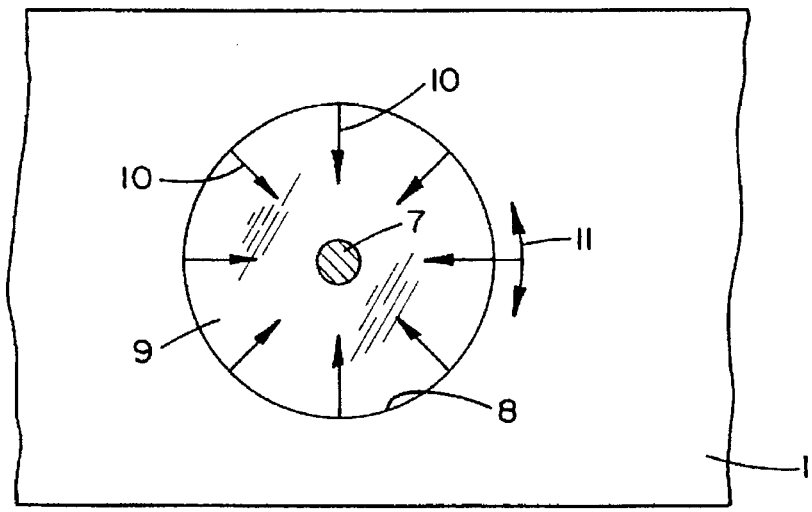
FIG. 3 illustrates a view, on an enlarged scale, of a compression glass lead-in arrangement as shown in FIG. 2.

The operative mechanism of the compression glass lead-in or lead-through arrangement is now described in greater detail with reference to FIGS. 3 and 4. In order to produce a good sealing effect at the interface between the metal housing and the glass bead 9, high compressive forces must be applied to the glass by the metal. In that respect, it is important to know that glass is able to sustain high compressive forces but only low tensile forces without being destroyed. It is also an important aspect that a build-up of a compressive stress is encountered after the glass bead 9 has been fused into the bore 8, which occurs at about 950° C., during the cooling phase. As can be seen from FIG. 3, besides the compressive forces, shown by arrows 10, tangential tensile forces, shown by arrows 11, are also generated in the metal housing 1. The tangential tensile forces rise in proportion to increases in the compressive forces. The crucial consideration for the obtaining of a hermetically-sealing glazing effect is that the elastic limit of the metal is not exceeded by the foregoing tangential forces during the cooling procedure or subsequently, since if that were the case, the bore would no longer provide a sealing integrity.

It is further significant that, as a result of the high coefficient of thermal expansion relative to the glass and its high elastic limit, the metal can still exert an excessive compressive force against the fused-in glass bead 9, even after the cooling operation. This is achieved by using types of glass possessing low coefficients of thermal expansion which are selected to be clearly lower than that of the metal. Typical values with respect to the material pairings described herein, are coefficients of expansion α of 80–180× $10^{-7}$/°C. for the metal and 45–110× $10^{-7}$/°C. for the glass.

The level of the encountered compressive stresses is dependent upon the difference between the coefficients of expansion Δα of metal and glass.

In addition, the kinds of glass which are to be used are adapted to evidence a good chemical resistance to corrosive atmospheres and superior insulation properties.

Figure 4:
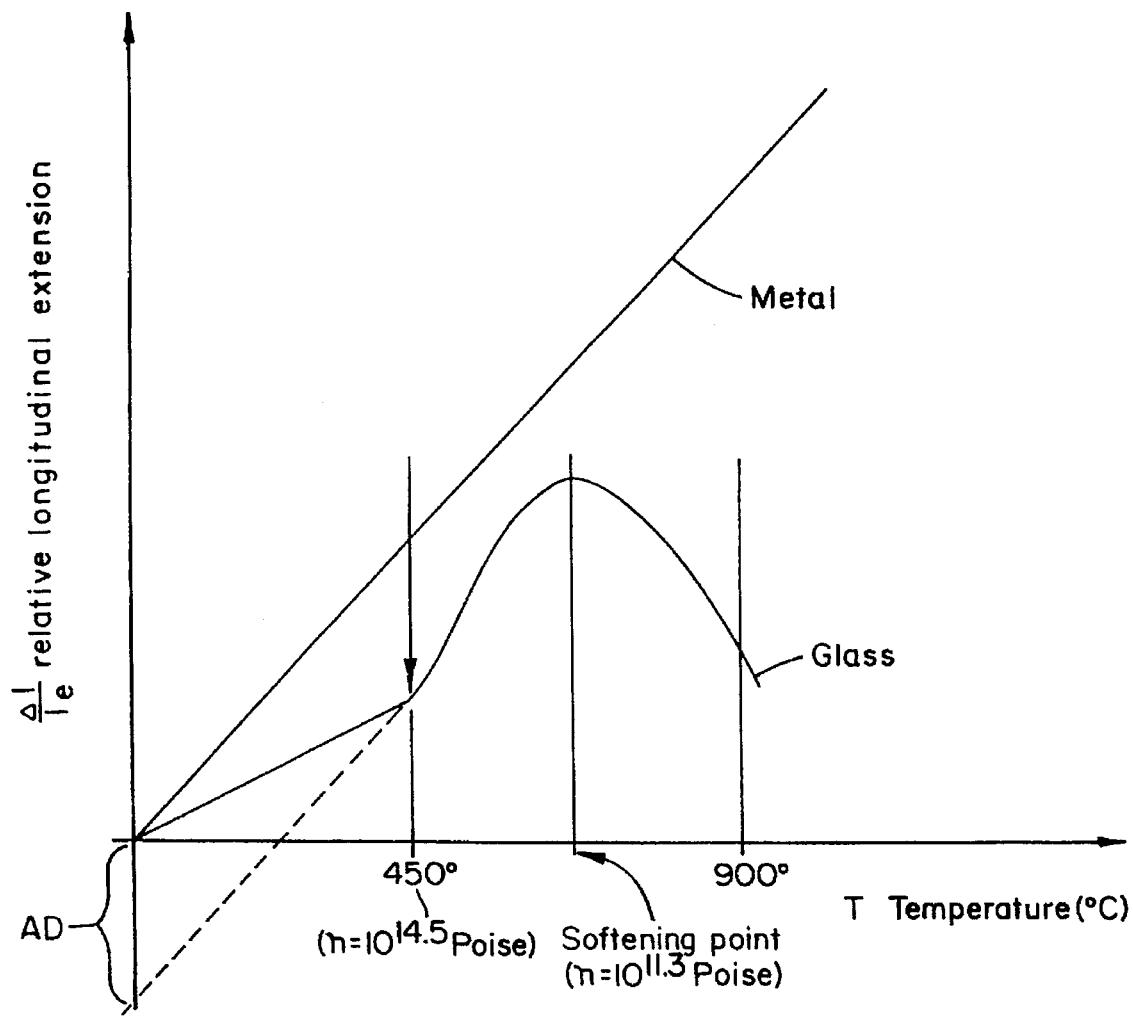
FIG. 4 illustrates a graph representing the dependency, in principle, of the coefficient of thermal expansion on temperature with regard to, respectively, glass and metal.

FIG. 4 illustrates a qualitative representation of the coefficients of thermal expansion of metal and glasses which are characteristic for the presently intended use, shown plotted in dependence upon temperature. The magnitude of the spacing between the two curves is intended to show the compressive stresses which the metal applies to the glass during the cooling operation. The wider that spacing; for example, at a temperature of 450° C., the higher are the compressive stresses at room temperature, based on the assumption that the metal possesses a sufficiently high level of strength to be able to withstand the encountered tangential tensile forces, without plastic deformation, at room temperature. At about 450° C. there is present the so-called Strain Point of the glass, at which point the glass has a viscosity of η=$10^{14.5}$ [poises]. From that temperature, the glass, which is fused into the metal portion, begins to absorb stresses upon cooling thereof, by virtue of the further decreasing viscosity.

In FIG. 4, AD represents a measurement in respect of the magnitude of the compressive stresses at room temperature. It becomes apparent that, with an increasing difference between the coefficients of expansion of the outer metal portion and that of the glass, AD becomes greater, and thus greater compressive stresses are produced which however, in turn, render it necessary for the metal to possess a higher elastic limit, in order to avoid that it becomes plastic in nature.

It has now been found that alloys of the system Cu Ni Sn Mn, unlike ordinary or common copper alloys, substantially increase their elastic limit upon cooling from a high temperature so that, notwithstanding the difference in expansion of metal and glass, the elastic limit is not expected to be exceeded. Further, it has also been found that alloys with a low nickel and tin content admittedly have the advantage of a good thermal conductivity but do not possess a very high elastic limit. By virtue of the above-described behavior upon cooling, such alloys are suitable for providing the desired hermetic sealing effect, but do not exert such high compressive stresses at room temperature against the glass body, as would the more highly alloyed alloys. The result of this is that, at a very low working temperature range; for example, below 0° C., for the finished housing the sealing integrity would be entirely lost. Therefore, the low-alloyed alloys are primarily employed when a very high level of thermal conductivity is required, but the working range is contrastingly within the lower temperature range. In contrast, the situation is different with regard to alloys possessing a high nickel and tin content. The particular advantages of such alloys are clear with regard to extremely high elastic limits and with a level of thermal conductivity which still remains good. Because of the high elastic limit, those alloys can be operated within a very high temperature range of; for example, −60° to 500° C. as a test temperature. The foregoing means that the 'reserve' in terms of hermetic sealing integrity is very large, thus providing a very good level of resistance to fluctuations in temperature.

Figure 5:
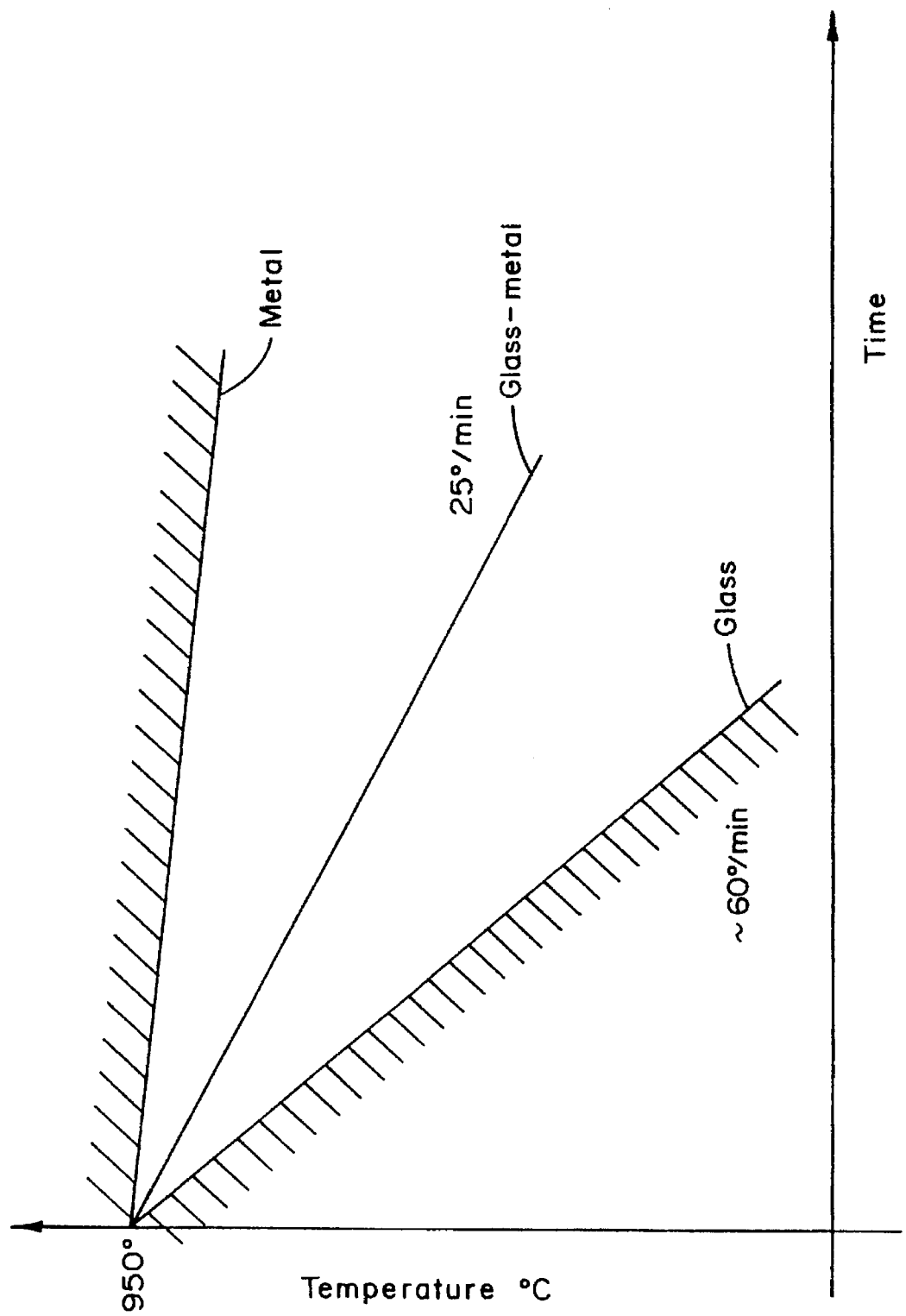
FIG. 5 illustrates a graph showing the configuration, in principle, of the limiting curves for the cooling rate of the glass-metal system.

FIG. 5 is a graph showing, in principle, the limiting curves for the possible cooling curves for a compression glass lead-through arrangement. There can be ascertained that the limiting curve for glass extends fairly steeply; in essence, the glass can be cooled relatively quickly. The limiting curve for the slow cooling of metal extends fairly flat, showing that it can be cooled very slowly. During the cooling operation which is carried out in a furnace pursuant to an established cooling profile, the metal-glass system can with assurance be cooled down over a wide temperature range. However, if the cooling takes place too rapidly, the expansion characteristic of glass is altered; so as to resultingly necessitate an upper limitation to the cooling rate. If cooling takes place too slowly, an inadequate potential for the hardening process is attained in the metal. Therefore, the range in terms of cooling rate should be at a minimum of about 10° C./minute and a maximum of about 60° C./minute.

As can be ascertained from Table 1, the elastic limit is correspondingly increased during the cooling operation in the case of alloys of type CuNiSn. The illustrated alloys are present in a condition without any post-treatment, after the cooling operation. The Table shows the results of tests in which the elastic limit $Rp_{0.1}$ and the tensile strength Rm of a soft-annealed material (metal) were measured prior to a heating procedure as is used in a glassing-in operation (750° C., 30 minutes, then water-quenched), and subsequent to such a procedure.

It can be seen that the elastic limit markedly rises even after the heating procedure and with an increasing tin and nickel content. The tensile strength shows a similar variation as it would from nickel contents of more than 2%.

TABLE 1

| Alloy | DIEHL No B = strip ZP = tensile test | Tensile strength (before) $Rp_{0.2}/Rm[N/mm^2]$ | Tensile strength (after) $Rp_{0.2}/Rm[N/mm^2]$ |
| --- | --- | --- | --- |
| Sn1Ni1 | 1B/ZP | 81/247 | 81/245 |
| Sn2Ni1.5 | 2B/ZP | 80/273 | 80/260 |
| Sn3Ni2.5 | 3B/ZP | 99/298 | 101/283 |
| Sn4Ni2 | 4B/ZP | 111/306 | 116/311 |
| Sn4Ni3 | 5B/ZP | 115/317 | 121/323 |
| Sn4Ni5 | 7B/ZP | 120/333 | 130/344 |
| Sn8Ni3 | 9B/ZP | 152/354 | 160/365 |
| Sn8Ni5 | 10B/ZP | 169/385 | 190/397 |
| Sn8Ni7 | 11B/ZP | 173/399 | 253/407 |
| Sn8Ni8 | 12B/ZP | 181/409 | 298/487 |

It has now been found that the elastic limit of the alloy can be further increased by a heat treatment subsequent to the cooling operation. The corresponding conditions are set forth in Table 2.

Ascertainable from the example of the alloy CuSn2Ni9 is that upon heating to 320° C. and holding that temperature for a period of 2 hours, the elastic limit rises from about 93 to 125 N/mm². In the event that alloy is then heated to 320° C. for a further five hours, the elastic limit rises to about a value of 170.

TABLE 2

| | Elastic Light $Rp_{0.2}[N/mm^2]$ | Tensile strength $Rm[N/mm^2]$ |
| --- | --- | --- |
| Value after the glazing-in procedure | 93 | 312 |
| additional 2 hours, 320° C. | 125 | 344 |
| additional 7 hours, 320° C. | 170 | 386 |

A clearly evident increase is also found in the tensile strength.

A clear increase in the elastic limit during the cooling procedure is also encountered in the case of the investigated alloys CuCrZr. In that case, the primary emphasis is on the very high level of thermal conductivity, although the increase in the elastic limit is also noteworthy but, in terms of its absolute value, lags behind that of the highly alloyed CuNiSn-alloys. Alloys of that kind are therefore preferably employed where a particularly high level of thermal conductivity is an important consideration, but not high working temperatures because of the lower level of compression stresses.

Figure 6:
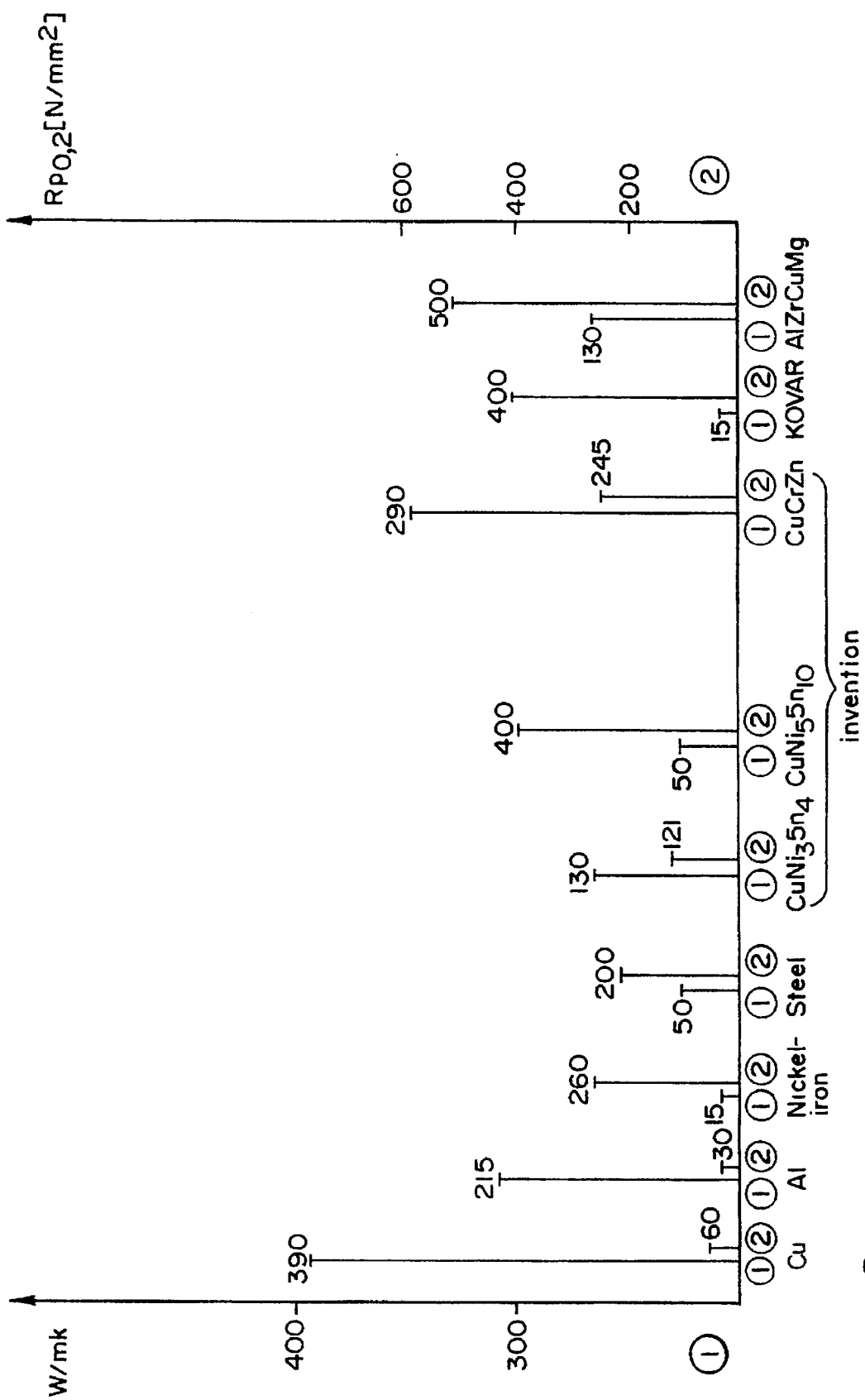
FIG. 6 illustrates a graphical comparison between various physical values of the alloys according to the invention with regard to comparative materials.

FIG. 6 plots a comparison between the alloys according to the invention and various comparative materials. It is possible to ascertain herein the differences between the alloys provided in accordance with the invention and the comparative materials.

Although the listed values in the measurements with regard to the alloys CuNiSn were measured on material in strip form, the alloy, possessing approximately the same properties may also be in the shape of castings, forgings or extruded components.

With regard to the production of compression glass lead-in or lead-through arrangements with alloys of the type CuNiSn, it is important to note that the melting temperature of the alloys is higher than the glazing-in temperature of the glass; in effect, above 950° C. Cooling is effected after the glass beads have been fused into the bore in the housing, and the conductor has been inserted into the molten mass of glass, and is desirably carried out at a rate of about 10° to 25° C./minute. In that respect, the gradient of the cooling operation within the higher temperature range can reach values of up to 50° C./minute and even somewhat higher but, if possible, should not fall below a value of 10° C./minute. The cooled compression glass lead-through arrangement is then again heated to about 320° C., and aged while hot for about two hours at a constant temperature. Depending upon the desired purpose of application, either high-alloy or low-alloy may be used for this purpose. It has shown itself to be desirable to add manganese to the alloy, up to a maximum of 0.4% by weight in order to reach fusion temperatures above 950° C.

What is claimed is:

1. A housing formed of a metal body and having an opening therethrough and a conductor extending through said opening, and having a lead-in arrangement comprising a glass bead sealing said opening wherein said conductor passes through said glass bead, wherein said lead-in arrangement is produced by:

(A)
  (i) heating said metal body to a high temperature; and
  (ii) placing said glass, in molten form, and said conductor in said opening such that said molten glass seals said opening and said conductor passes through said molten glass and through said opening, wherein the high temperature to which said metal body is heated is at least as high as the temperature of said molten glass, and the temperature of said molten glass is less than or equal to the solidus temperature of the metal, wherein said glass has a coefficient of expansion which is lower than the coefficient of expansion of said metal, and said metal body is formed of a metal alloy comprising 0.1–10% Ni, 0.1–12% Sn, and 0–0.4% Mn by weight, with the balance being Cu which possesses a hardening effect upon cooling, and (B) cooling said metal body and said molten glass in said opening, at a rate which is less than the rate at which the expansion characteristic of glass is altered, and which is high enough to permit said metal to exhibit said hardening effect upon cooling.

2. A housing as claimed in claim 1, wherein said molten glass has a composition of 65% by weight $SiO_2$, 5% $Al_2O_3$, 15% BaO+ZnO and 15% $Na_2+K_2O+Li_2O$.

3. A housing as claimed in claim 1, wherein said lead-in arrangement is cooled from a temperature of between about 800° to 1000° C. at a rate of higher than 10° C./minute to about room temperature.

4. A housing as claimed in claim 3, wherein, during the cooling phase, the temperature is maintained constant within the range of about 250° to 450° C. for from several minutes to several hours.

5. A housing as claimed in claim 1, wherein said lead-in arrangement is heated after the cooling phase to a temperature of between about 250° C. to 450° C., and aged while hot for between 1 minute to 10 hours.

6. A housing as claimed in claim 5, wherein said temperature is about 320° C.

7. A housing as claimed in claim 5, wherein said ageing is for a period of time of from 2 to 6 hours.

8. A housing as claimed in claim 3, wherein subsequent to cooling, said lead-in arrangement is heated to a temperature of at least 250° C., and thereafter heated stepwise to a maximum of 450° C., each said step being maintained for between 1 minute and 2 hours.

9. A housing as claimed in claim 1, wherein said conductor is embedded in the glass and insulated by the glass from the metal body, the coefficients of thermal expansion of said conductor and said glass being approximately equal to each other.

10. A housing as claimed in claim 1, wherein the metal is a cast piece, a strip, an extruded piece or a forged piece.

11. A housing formed of a metal body and having an opening therethrough and a conductor extending through said opening, and having a lead-in arrangement comprising a glass bead sealing said opening wherein said conductor passes through said glass bead, wherein said lead-in arrangement is produced by (A)
  (i) heating said metal body to a high temperature; and
  (ii) placing said glass, in molten form, and said conductor in said opening such that said molten glass seals said opening and said conductor passes through said molten glass and through said opening, wherein the high temperature to which said metal body is heated is at least as high as the temperature of said molten glass, and the temperature of said molten glass is less than or equal to the solidus temperature of the metal, wherein said glass has a coefficient of expansion which is lower than the coefficient of expansion of said metal, and said metal body is formed of a metal alloy comprising 0.1–5% Cr and 0.01–5% Zr by weight, with the balance being Cu which possesses a hardening effect upon cooling, and (B) cooling said metal body and said molten glass in said opening, at a rate which is less than the rate at which the expansion characteristic of glass is altered, and which is high enough to permit said metal to exhibit said hardening effect upon cooling.

* * * * *

UNITED STATES PATENT AND TRADEMARK OFFICE
CERTIFICATE OF CORRECTION

PATENT NO. : 5,633,531
DATED : May 27, 1997
INVENTOR(S) : Wolfgang Hornig, et al.

It is certified that error appears in the above-indentified patent and that said Letters Patent is hereby corrected as shown below:

Column 3, line 24: delete "u"

Column 5, line 22: after "be" delete -- - --

Column 8, line 35: "Light" should read --limit--

Column 10, line 5, Claim 5: "claim 1" should read --claim 3--

Signed and Sealed this

Tenth Day of March, 1998

Attest:

BRUCE LEHMAN

*Attesting Officer*    *Commissioner of Patents and Trademarks*